United States Patent
Chiu et al.

(10) Patent No.: US 7,944,038 B2
(45) Date of Patent: May 17, 2011

(54) SEMICONDUCTOR PACKAGE HAVING AN ANTENNA ON THE MOLDING COMPOUND THEREOF

(75) Inventors: Chi-Tsung Chiu, Kaohsiung (TW); Pao-Nan Lee, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 12/387,293

(22) Filed: Apr. 30, 2009

(65) Prior Publication Data
US 2009/0289343 A1 Nov. 26, 2009

(30) Foreign Application Priority Data
May 21, 2008 (TW) ................ 97118709 A

(51) Int. Cl.
*H01L 23/52* (2006.01)
*H01L 21/50* (2006.01)
*H01L 23/498* (2006.01)
*H01L 23/02* (2006.01)

(52) U.S. Cl. ........... 257/690; 257/E23.069; 257/E23.18; 257/E21.499; 257/E21.597; 257/659; 257/774; 257/773; 257/738; 257/778; 257/728

(58) Field of Classification Search .............. 257/690, 257/E23.069, 659, 680, 774, 773, E21.499, 257/E23.18, E21.597, 737, 738, 778, 728; 438/667
See application file for complete search history.

(56) References Cited

U.S. PATENT DOCUMENTS

| 7,042,398 | B2 * | 5/2006 | Tang et al. ............. 343/700 MS |
| 2001/0052645 | A1 | 12/2001 | Op'T Eynde et al. |
| 2007/0164420 | A1 * | 7/2007 | Chen et al. ................... 257/691 |
| 2008/0197491 | A1 * | 8/2008 | Matsui .......................... 257/737 |
| 2009/0075478 | A1 * | 3/2009 | Matsui .......................... 438/667 |
| 2009/0184882 | A1 * | 7/2009 | Jow ............................... 343/873 |
| 2009/0267221 | A1 * | 10/2009 | Fujii ............................. 257/698 |
| 2009/0302437 | A1 * | 12/2009 | Kim et al. .................... 257/659 |
| 2010/0059879 | A1 * | 3/2010 | Bielen .......................... 257/712 |
| 2010/0102428 | A1 * | 4/2010 | Lee et al. ..................... 257/686 |

FOREIGN PATENT DOCUMENTS

| CN | 1369914 A | 9/2002 |
| CN | 201194229 Y | 2/2009 |

OTHER PUBLICATIONS

Chinese Office Action Aug. 1, 2009, Patent #200810099853.X.

* cited by examiner

*Primary Examiner* — Alexander O Williams
(74) *Attorney, Agent, or Firm* — McCracken & Frank LLP

(57) ABSTRACT

The present invention relates to a semiconductor package having an antenna. The semiconductor package includes a substrate, a chip, a molding compound and an antenna. The substrate has a first surface and a second surface. The chip is disposed on the first surface of the substrate, and electrically connected to the substrate. The molding compound encapsulates the whole or a part of the chip. The antenna is disposed on the molding compound, and electrically connected to the chip. The antenna is disposed on the molding compound that has a relatively large area, so that the antenna will not occupy the space for the substrate.

10 Claims, 4 Drawing Sheets

SEMICONDUCTOR PACKAGE HAVING AN ANTENNA ON THE MOLDING COMPOUND THEREOF

BACKGROUND OF THE INVENTION

1. Field of the Invention

The present invention relates to a semiconductor package, and more particularly to a semiconductor package having an antenna on a molding compound.

2. Description of the Related Art

There is an obvious tendency for wireless communication modules to become smaller and lighter. Thus, designers are trying to integrate more devices into a package. However, an antenna usually occupies a relatively large area, so it's hard to be integrated into a package. A conventional method is to form the antenna on a substrate of the package. Since there are other devices to be disposed on the substrate, the area where the antenna forms is limited.

Therefore, it is necessary to provide an innovative and advanced semiconductor package having an antenna to solve the above problems.

SUMMARY OF THE INVENTION

The present invention is directed to a semiconductor package having an antenna. The semiconductor package comprises a substrate, a chip, a molding compound and an antenna. The substrate has a first surface and a second surface. The chip is disposed on the first surface of the substrate, and electrically connected to the substrate. The molding compound encapsulates the whole or a part of the chip. The antenna is disposed on the molding compound, and electrically connected to the chip. The antenna is disposed on the molding compound that has a relatively large area, so that the antenna will not occupy the space for the substrate. Therefore, the antenna can be integrated into the semiconductor package without increasing the size of the original package. Moreover, the antenna is exposed outside the molding compound, so as to raise the efficiency of the antenna.

DETAILED DESCRIPTION OF THE INVENTION

Figure 1:
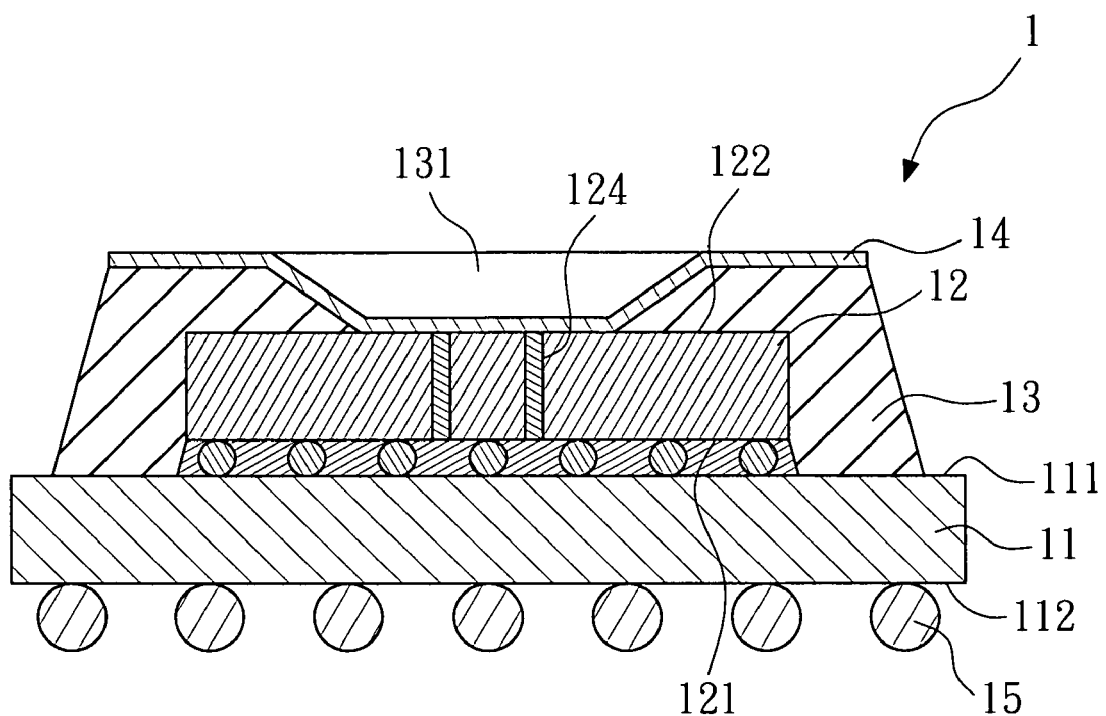
FIG. 1 is a cross-sectional view of a semiconductor package having an antenna according to a first embodiment of the present invention.

FIG. 1 shows the cross-sectional view of the semiconductor package having an antenna according to the first embodiment of the present invention. The semiconductor package 1 comprises a substrate 11, a chip 12, a molding compound 13, an antenna 14 and a plurality of solder balls 15. The substrate 11 has a first surface 111 and a second surface 112. The chip 12 is disposed on the first surface 111 of the substrate 11, and electrically connected to the substrate 11. In the embodiment, the chip 12 has an active surface 121, a back surface 122, a circuit layer and at least one through silicon via 124. The circuit layer is disposed on the active surface 121. The active surface 121 is attached to the first surface 111 of the substrate 11 by flip chip bonding. The through silicon via 124 connects the back surface 122 and the circuit layer.

The molding compound 13 encapsulates part of the chip 12. In the embodiment, the molding compound 13 has an opening 131, so as to expose a part of the back surface 122 of the chip 12. The antenna 14, for example, an RF antenna, is disposed on the molding compound 13, and electrically connected to the chip 12. The antenna 14, for example, a discontinuous patterned metal layer, is copper or aluminum. In the embodiment, the antenna 14 is formed by coating a metal in the opening 131 of the molding compound 13, or the antenna 14 is adhered to the opening 131 of the molding compound 13, so that the antenna 14 contacts the back surface 122 of the chip 12 and the through silicon via 124, and is electrically connected to the substrate 11 by the through silicon via 124. It should be noted that the antenna 14 can extend to the side of the molding compound 13, but does not physically contact the substrate 11. The solder balls 15 are disposed on the second surface 112 of the substrate 11.

In the invention, the antenna 14 is disposed on the molding compound 13 that has a relatively large area, so that the antenna 14 will not occupy the space for the substrate 11. Therefore, the antenna 14 can be integrated into the semiconductor package 1 without increasing the size of the original package. Moreover, the antenna 14 is exposed outside the molding compound 13, so as to raise the efficiency of the antenna 14.

Figure 2:
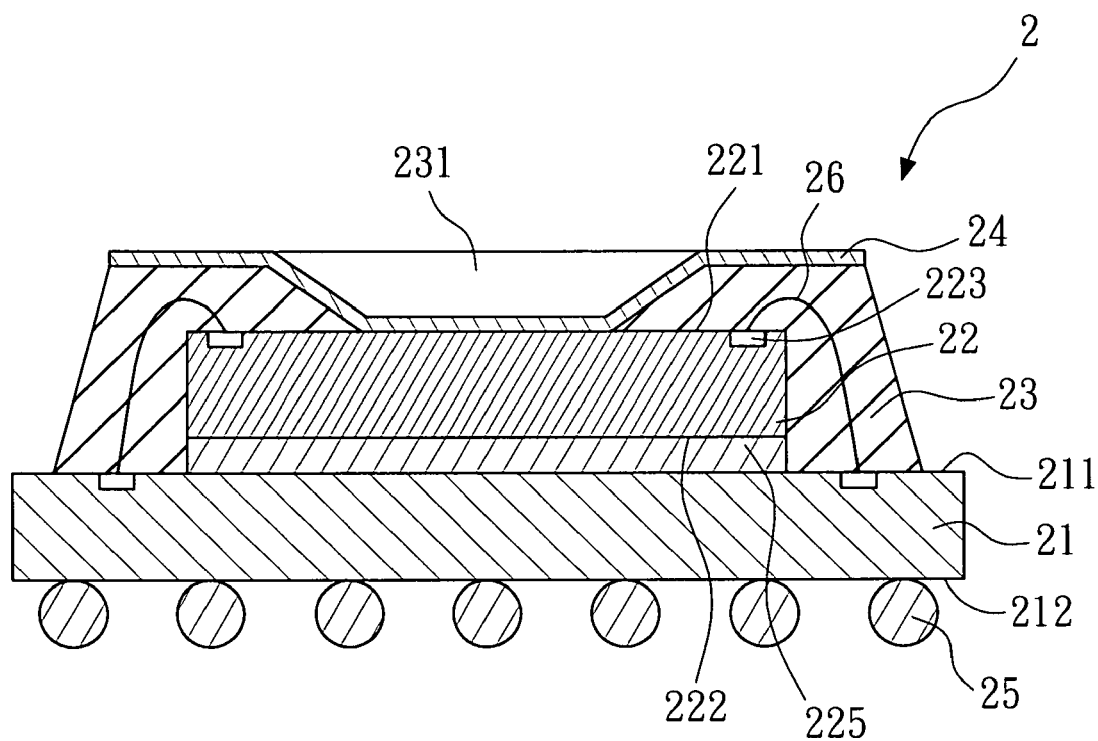
FIG. 2 is a cross-sectional view of a semiconductor package having an antenna according to a second embodiment of the present invention.
Figure 3:
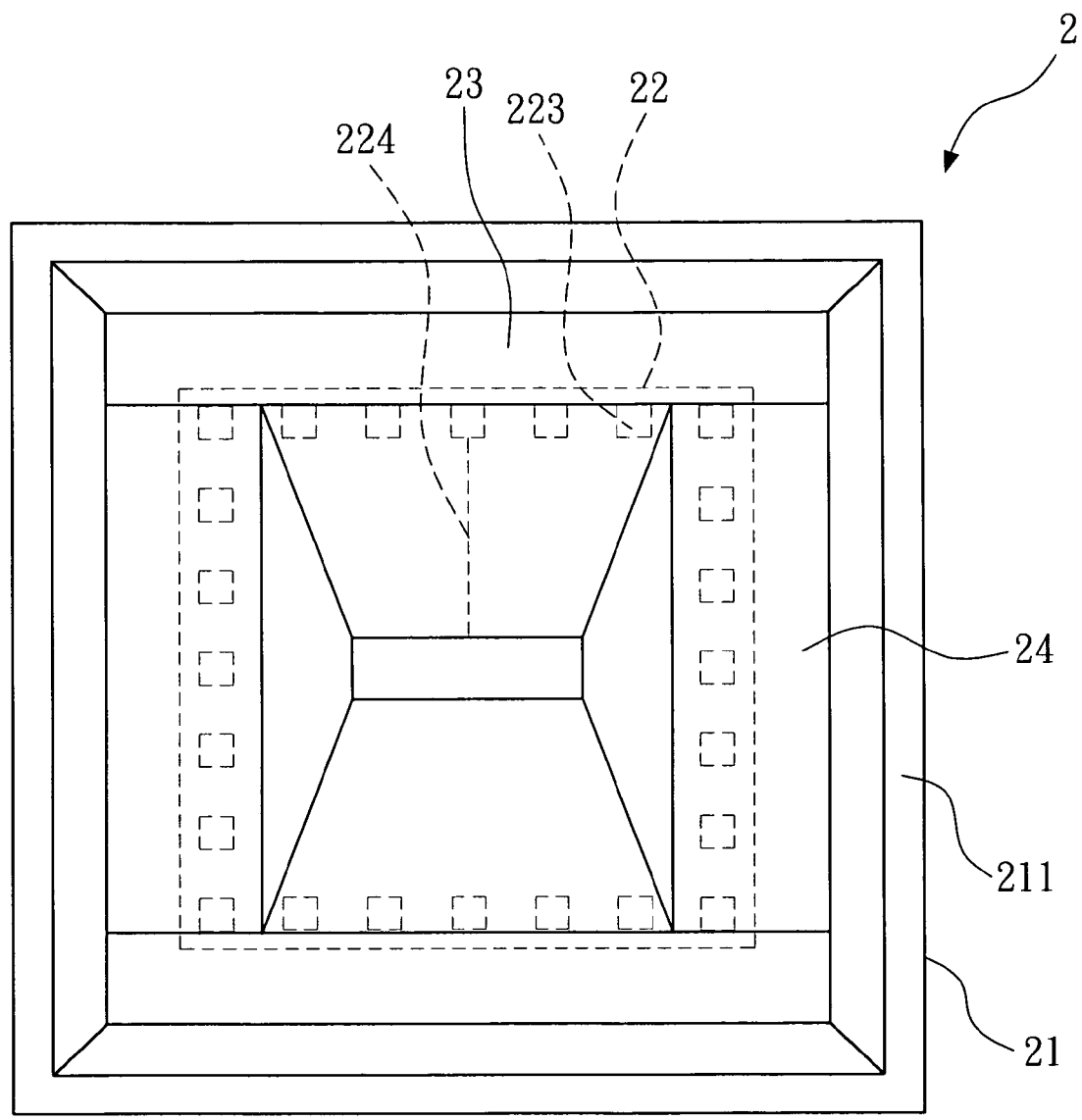
FIG. 3 is a top view of the semiconductor package having an antenna according to the second embodiment of the present invention.

FIG. 2 and FIG. 3 show the cross-sectional view and the top view of the semiconductor package having an antenna according to the second embodiment of the present invention respectively. The semiconductor package 2 comprises a substrate 21, a chip 22, a plurality of wires 26, a molding compound 23, an antenna 24 and a plurality of solder balls 25. The substrate 21 has a first surface 211 and a second surface 212. The chip 22 is disposed on the first surface 211 of the substrate 21, and electrically connected to the substrate 21. In the embodiment, the chip 22 has an active surface 221, a back surface 222, a plurality of pads 223 and a redistribution layer 224. The pads 223 and the redistribution layer 224 are disposed on the active surface 221. The back surface 222 is adhered to the first surface 211 of the substrate 21 by an adhesive 225. The wires 26 electrically connect the pads 223 to the first surface 211 of the substrate 21.

The molding compound 23 encapsulates part of the chip 22. In the embodiment, the molding compound 23 has an opening 231, so as to expose part of the active surface 221 of the chip 22. The antenna 24 is disposed on the molding compound 23, and electrically connected to the chip 22. The antenna 24, for example, is a discontinuous patterned metal layer. In the embodiment, the antenna 24 is formed by coating a metal in the opening 231 of the molding compound 23, or the antenna 24 is adhered to the opening 231 of the molding compound 23, so that the antenna 24 contacts the active surface 221 of the chip 22, and is electrically connected to the pads 223 by the redistribution layer 224. The solder balls 25 are disposed on the second surface 212 of the substrate 21.

Figure 4:
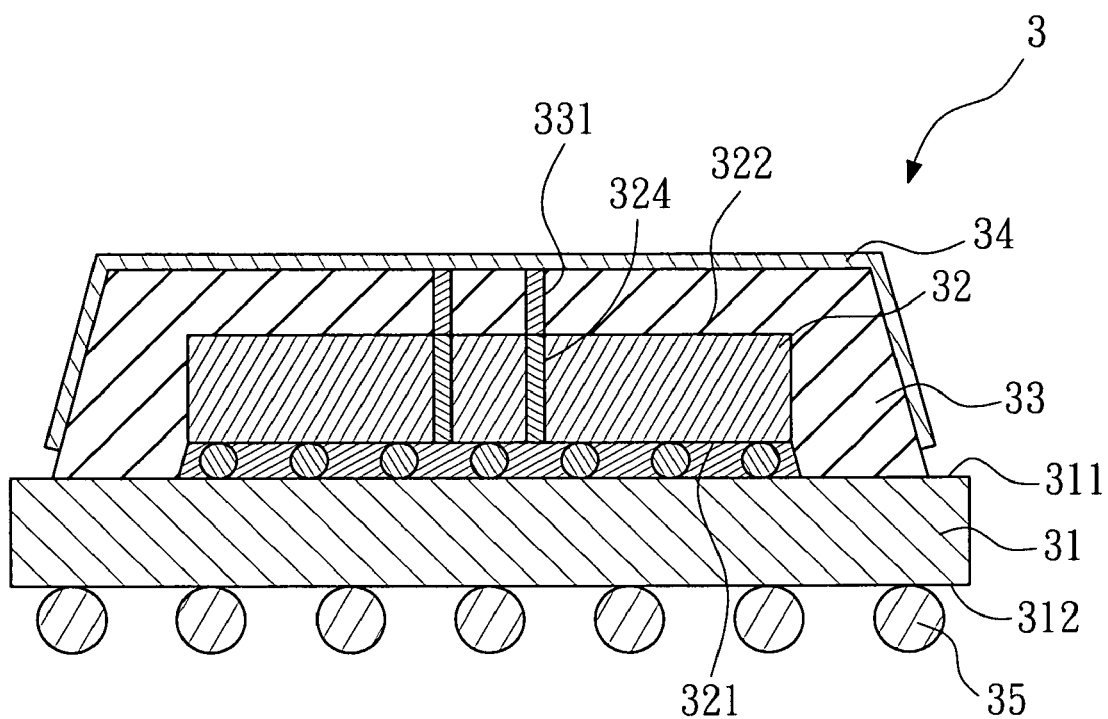
FIG. 4 is a cross-sectional view of a semiconductor package having an antenna according to a third embodiment of the present invention.

FIG. 4 shows the cross-sectional view of the semiconductor package having an antenna according to the third embodiment of the present invention. The semiconductor package 3 comprises a substrate 31, a chip 32, a molding compound 33, an antenna 34 and a plurality of solder balls 35. The substrate 31 has a first surface 311 and a second surface 312. The chip 32 is disposed on the first surface 311 of the substrate 31, and electrically connected to the substrate 31. In the embodiment, the chip 32 has an active surface 321, a back surface 322, a circuit layer and at least one through silicon via 324. The circuit layer is disposed on the active surface 321. The active surface 321 is attached to the first surface 311 of the substrate 31 by flip chip bonding. The through silicon via 324 connects the back surface 321 and the circuit layer.

The molding compound 33 encapsulates the whole of the chip 32. In the embodiment, the molding compound 33 further comprises at least one molding compound via 331 that connects to the through silicon via 324. The antenna 34 is disposed on the molding compound 33, and electrically connected to the chip 32. The antenna 34, for example, is a discontinuous patterned metal layer. In the embodiment, the antenna 34 is formed by coating a metal on the molding compound 33, or the antenna 34 is adhered to the molding compound 33, so that the antenna 34 contacts the molding compound via 331, and is electrically connected to the substrate 31 by the molding compound via 331 and the through silicon via 324. It should be noted that the antenna 34 can extend to the side of the molding compound 33, but does not physically contact the substrate 31. The solder balls 35 are disposed on the second surface 312 of the substrate 31.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined in the appended claims.

What is claimed is:

1. A semiconductor package having an antenna, comprising:
    a substrate, having a first surface and a second surface;
    a chip, disposed on the first surface of the substrate, and electrically connected to the substrate; wherein the chip has an active surface a back surface a circuit layer and at least one through silicon via, the circuit layer is disposed on the active surface, the active surface is attached to the first surface of the substrate by flip chip bonding, and the through silicon via connects the back surface and the circuit layer;
    a molding compound, encapsulating the whole or a part of the chip; and
    an antenna, disposed on the molding compound, electrically connected to the through silicon via of the chip, and electrically connected to the substrate by the through silicon via.

2. The semiconductor package as claimed in claim 1, wherein the molding compound has an opening, so as to expose the back surface of the chip, and the antenna contacts the back surface and the through silicon via of the chip.

3. The semiconductor package as claimed in claim 1, wherein the molding compound encapsulates the whole of the chip, the molding compound further comprises at least one molding compound via, the molding compound via connects the through silicon via, and the antenna contacts the molding compound via.

4. The semiconductor package as claimed in claim 1, further comprising a plurality of wires, wherein the chip has a plurality of pads and a redistribution layer, the pads and the redistribution layer are disposed on the active surface, the back surface is adhered to the first surface of the substrate, the wires electrically connect the pads to the first surface of the substrate, the molding compound has an opening, so as to expose part of the active surface of the chip, the antenna contacts the active surface of the chip, and is electrically connected to the pads by the redistribution layer.

5. The semiconductor package as claimed in claim 1, wherein the antenna is formed by coating a metal on the molding compound.

6. The semiconductor package as claimed in claim 1, wherein the antenna is adhered to the molding compound.

7. The semiconductor package as claimed in claim 1, wherein the antenna extends to the side of the molding compound.

8. The semiconductor package as claimed in claim 1, wherein the antenna doesn't physically contact the substrate.

9. The semiconductor package as claimed in claim 1, further comprising a plurality of solder balls disposed on the second surface of the substrate.

10. The semiconductor package as claimed in claim 1, wherein the antenna is a discontinuous patterned metal layer.

* * * * *